US011503748B2

(12) United States Patent
Lee et al.

(10) Patent No.: US 11,503,748 B2
(45) Date of Patent: Nov. 15, 2022

(54) ELECTROMAGNETIC-WAVE-SHIELDING SHEET CAPABLE OF DISSIPATING HEAT OF ELECTRONIC COMPONENT AND ELECTRONIC DEVICE INCLUDING THE SAME

(71) Applicant: Samsung Electronics Co., Ltd., Suwon-si (KR)

(72) Inventors: Haejin Lee, Suwon-si (KR); Dongku Kang, Suwon-si (KR); Jihong Kim, Suwon-si (KR); Min Park, Suwon-si (KR); Yunjeong Park, Suwon-si (KR); Kyuhwan Lee, Suwon-si (KR); Jinhwan Jung, Suwon-si (KR); Ahreum Hwang, Suwon-si (KR); Kyungha Koo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 99 days.

(21) Appl. No.: 17/166,248

(22) Filed: Feb. 3, 2021

(65) Prior Publication Data

US 2021/0251110 A1    Aug. 12, 2021

(30) Foreign Application Priority Data

Feb. 11, 2020    (KR) .................. 10-2020-0016666

(51) Int. Cl.
*H05K 9/00* (2006.01)
*H05K 7/20* (2006.01)
*H05K 1/02* (2006.01)

(52) U.S. Cl.
CPC ......... *H05K 9/0026* (2013.01); *H05K 1/0204* (2013.01); *H05K 7/20* (2013.01); *H05K 9/009* (2013.01)

(58) Field of Classification Search
CPC ................. H05K 9/009; H05K 7/20
See application file for complete search history.

(56) References Cited

U.S. PATENT DOCUMENTS 9,007,739 B2 * 4/2015 Fornes .................. C09D 5/24
361/117
10,465,317 B2 11/2019 Schauer et al.
(Continued)

FOREIGN PATENT DOCUMENTS

KR    10-2015-0098218 A    8/2015
KR       10-1610701 B1    4/2016
(Continued)

OTHER PUBLICATIONS

International Search Report and Written Opinon dated Jun. 1, 2021, issued in International Patent Application No. PCT/KR2021/001404.

*Primary Examiner* — Hung V Ngo
(74) *Attorney, Agent, or Firm* — Jefferson IP Law, LLP

(57) ABSTRACT

A portable communication device is provided. A portable communication device includes a first nanofiber member having a first density, a second nanofiber member attached to the first nanofiber member and having a second density lower than the first density, a heat transfer member positioned on or above the second nanofiber member, and a conductive material coated on at least a portion of the first nanofiber member and the second nanofiber member. At least some of the conductive material may penetrate into the first nanofiber member or the second nanofiber member. Various other embodiments may be possible.

23 Claims, 14 Drawing Sheets

(56) References Cited

U.S. PATENT DOCUMENTS

| | | | |
|---|---|---|---|
| 10,757,846 B2 | 8/2020 | Lee et al. | |
| 2008/0170982 A1* | 7/2008 | Zhang | H01L 51/444 |
| | | | 423/447.3 |
| 2009/0291608 A1 | 11/2009 | Choi et al. | |
| 2011/0014356 A1* | 1/2011 | Fornes | C08G 59/58 |
| | | | 324/72 |
| 2011/0278058 A1* | 11/2011 | Sundararaj | H05K 9/009 |
| | | | 977/932 |
| 2013/0299214 A1* | 11/2013 | Frey | H05K 3/061 |
| | | | 174/253 |
| 2014/0011414 A1* | 1/2014 | Kruckenberg | B64C 3/20 |
| | | | 87/8 |
| 2016/0044834 A1* | 2/2016 | Hansen | H05F 3/02 |
| | | | 174/2 |
| 2017/0265338 A1* | 9/2017 | Kim | H05K 9/0096 |
| 2018/0029331 A1* | 2/2018 | Bortell | B32B 7/12 |
| 2020/0084921 A1* | 3/2020 | Seo | H05K 9/0022 |
| 2020/0329592 A1* | 10/2020 | Seo | B32B 5/266 |
| 2020/0352057 A1* | 11/2020 | Jung | H05K 7/20436 |

FOREIGN PATENT DOCUMENTS

| | | | |
|---|---|---|---|
| KR | 10-2017-0136063 A | | 12/2017 |
| KR | 10-2018-0068308 A | | 6/2018 |
| KR | 10-2019-0053589 A | | 5/2019 |
| KR | 10-2020-0017115 A | | 2/2020 |

* cited by examiner

| EMI-shielding power for each frequency | | |
|---|---|---|
| Frequency | X Direction | Y Direction |
| 600MHz | 37.4 dB | 36.2 dB |
| 750MHz | 39.8 dB | 38.1 dB |
| 900MHz | 41.4 dB | 39.9 dB |
| 1.5GHz | 49.1 dB | 47.3 dB |
| 2.5GHz | 53.8 dB | 50.3 dB |
| Average | 44.3 dB | 42.36 dB |

ELECTROMAGNETIC-WAVE-SHIELDING SHEET CAPABLE OF DISSIPATING HEAT OF ELECTRONIC COMPONENT AND ELECTRONIC DEVICE INCLUDING THE SAME

CROSS-REFERENCE TO RELATED APPLICATION(S)

This application is based on and claims priority under 35 U.S.C. 119(a) of a Korean patent application number 10-2020-0016666, filed on Feb. 11, 2020, in the Korean Intellectual Property Office, the disclosure of which is incorporated by reference herein in its entirety.

BACKGROUND

1. Field

The disclosure relates to an electromagnetic-wave-shielding sheet and an electronic device including the same.

2. Description of Related Art

In order to enhance the portability and convenience of an electronic device such as a smart phone, technological development for miniaturization, thickness reduction, and weight reduction is underway. In addition, components integrated in a small space are being located for high performance of mobile electronic devices.

An electronic device includes components for dissipating heat generated by components included therein and blocking electromagnetic waves.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic components having a high power density are applied to electronic devices. The electronic components having the high power density may be disposed on a printed circuit board having a limited area, and may thus generate heat in the electronic devices. Due to the high heating temperature of the electronic devices, the performance of the electronic devices may be deteriorated, or the lifespan of individual components and the electronic devices may be shortened. In addition, the temperature of the external surfaces of the electronic devices increases due to the increased heating temperature, which may be uncomfortable to a user. In addition, the high-power electronic components may generate electromagnetic waves as well as heat. Electromagnetic waves generated from the electronic components may cause deterioration in performance and lifespan of peripheral components and malfunction of mobile electronic devices, and may have a harmful effect on the human body.

In order to dissipate the heat generated from components of an electronic device, a thermal interface material (TIM) is applied. In addition, in order to block electromagnetic waves generated from a component of an electronic device, a shield can is applied such that a metal frame and a metal cover thereof surround components. By applying the shield can to an electronic device, it is possible to block electromagnetic interference (EMI) generated from heat-generating components such as an application processor (AP), a power management IC (PMIC), and a pulse amplitude modulator (PAM). However, the shield can may trap therein the heat generated from a component together with electromagnetic waves. Thus, the temperature inside the component may increase, and thus the performance and/or lifespan of the component may be deteriorated. In addition, when the shield can is applied, the thickness of the electronic device may increase.

Another aspect of the disclosure is to provide a shielding sheet capable of blocking electromagnetic waves as well as dissipating the heat generated from components of an electronic device, and an electronic device including the shielding sheet.

Additional aspects will be set forth in part in the description which follows and, in part, will be apparent from the description, or may be learned by practice of the presented embodiments.

In accordance with an aspect of the disclosure, a portable communication device is provided. The portable communication device includes a first nanofiber member having a first density, a second nanofiber member attached to the first nanofiber member and having a second density lower than the first density, a heat-transfer member positioned on or above the second nanofiber member, and a conductive material coated on at least a portion of the first nanofiber member and the second nanofiber member. At least some of the conductive material may penetrate into the first nanofiber member or the second nanofiber member.

In accordance with another aspect of the disclosure, a heat dissipation sheet is provided. The heat dissipation sheet includes a first nanofiber member having a first density, a second nanofiber member attached to the first nanofiber member and having a second density lower than the first density, a heat-transfer member positioned on or above the second nanofiber member, and a conductive material coated on at least a portion of the first nanofiber member and the second nanofiber member. At least some of the conductive material may penetrate into the first nanofiber member or the second nanofiber member.

In accordance with another aspect of the disclosure, a shielding sheet is provide. A shielding sheet includes blocking electromagnetic waves as well as dissipating the heat generated from a component (e.g., an AP, a communication chip, or a memory) of an electronic device.

According to various embodiments, it is possible to reduce the thickness of an electronic device by applying the shielding sheet.

According to various embodiments, when manufacturing an electronic device, it is possible to reduce the number of manufacturing operations and the cost of manufacturing the electronic device.

In addition, various other effects may be provided that may be directly or indirectly understood through this document.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
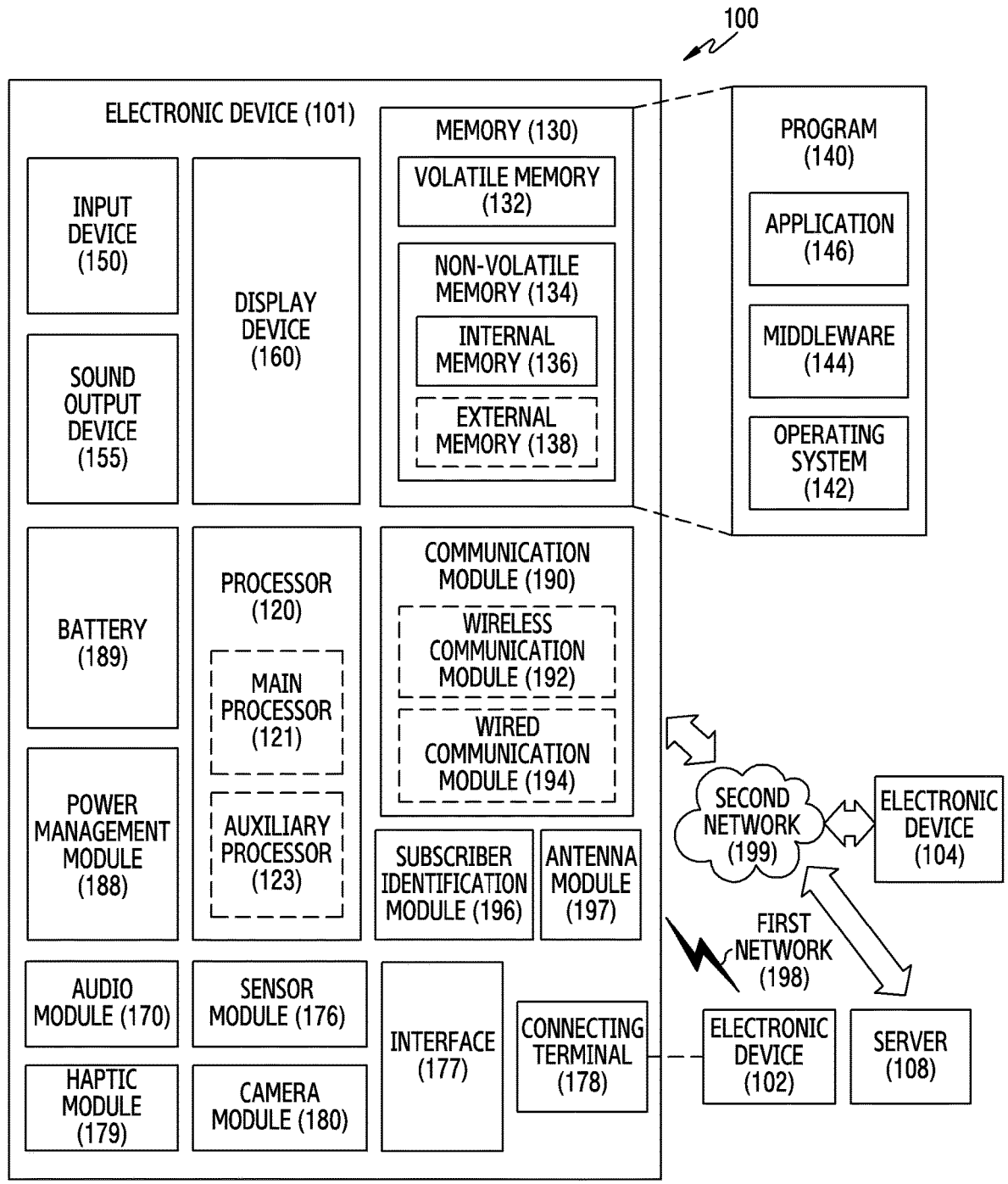
FIG. 1 is a block diagram illustrating an electronic device according to an embodiment of the disclosure.

FIG. 1 is a block diagram illustrating an electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, non-volatile memory 134 may include internal memory 136 and external memory 138. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture an image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
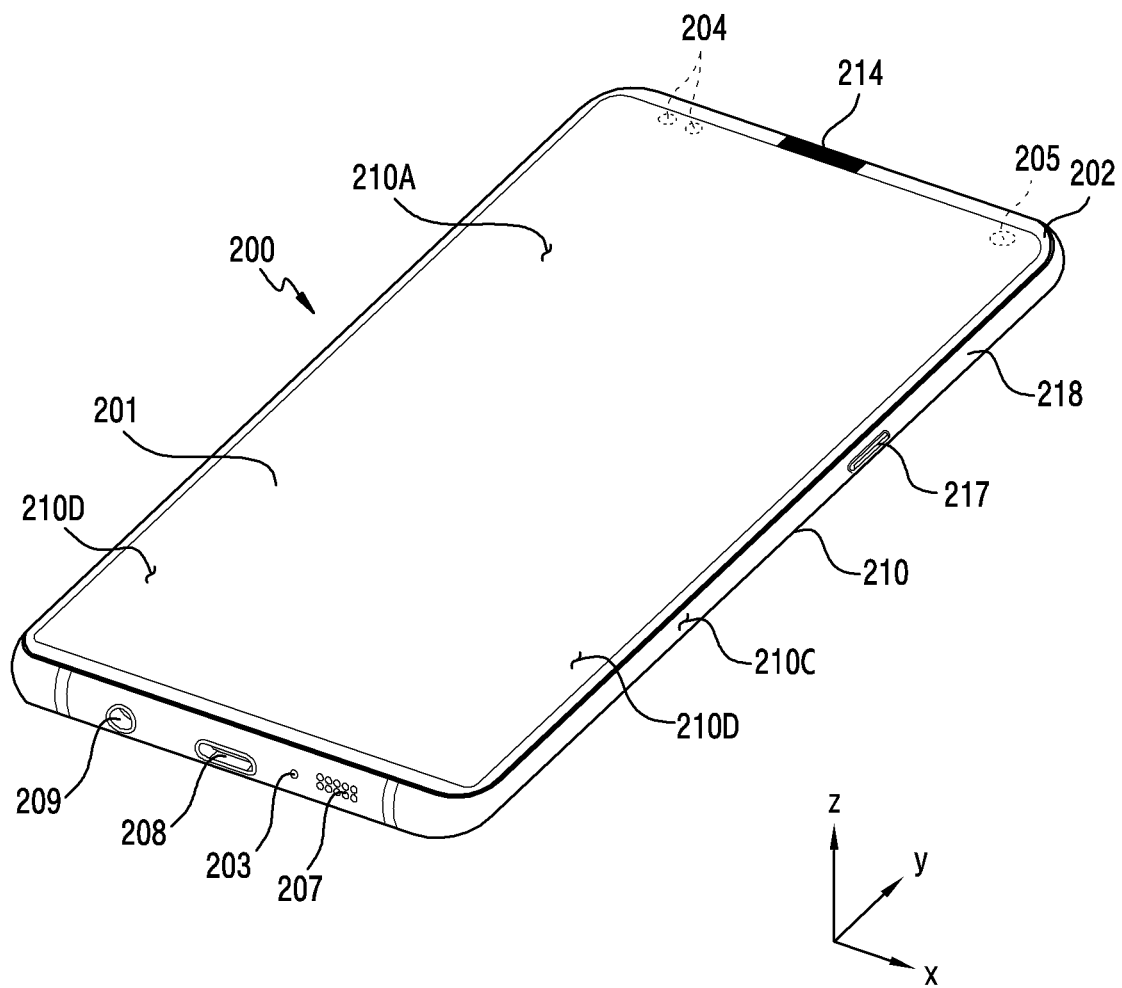
FIG. 2 is a front perspective view illustrating a mobile electronic device according to an embodiment of the disclosure.

FIG. 2 is a front perspective view illustrating a mobile electronic device according to an embodiment of the disclosure.

Figure 3:
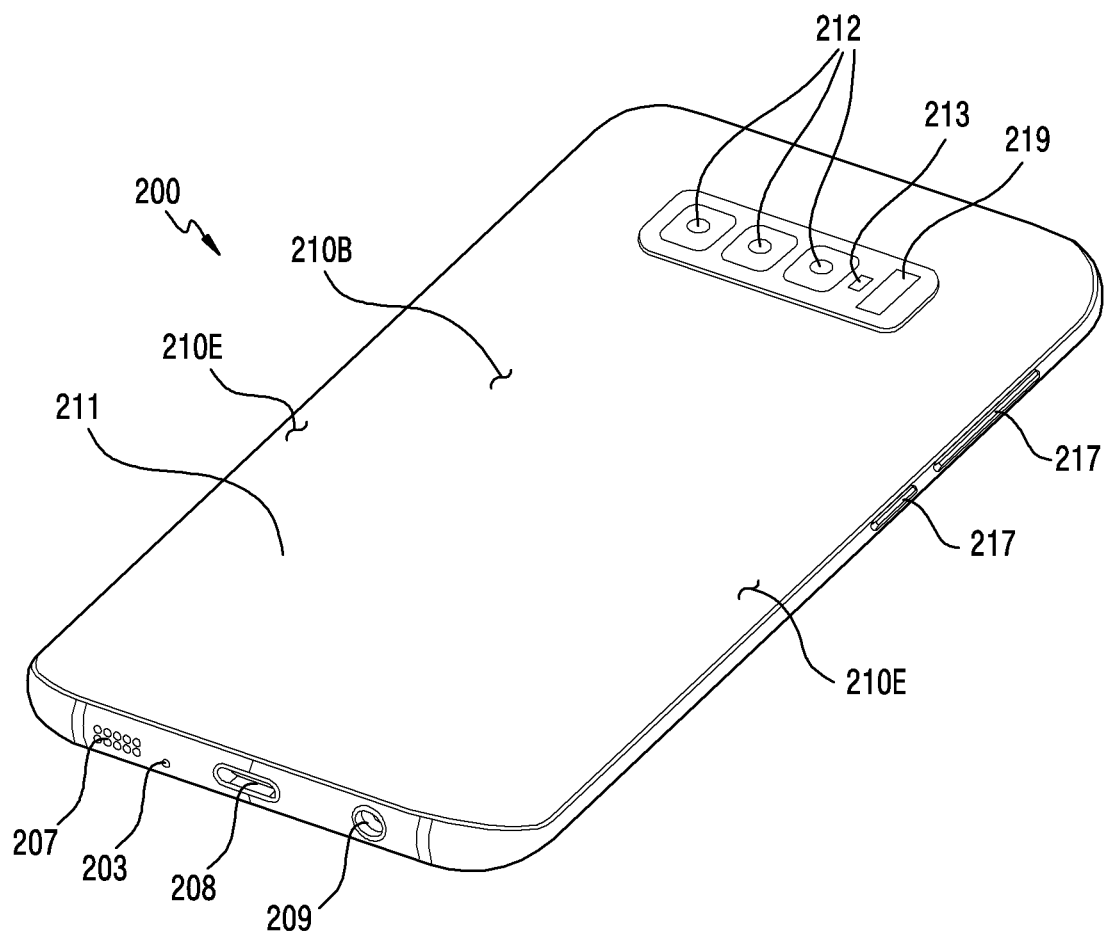
FIG. 3 is a rear perspective view illustrating an electronic device of FIG. 1 according to an embodiment of the disclosure.

FIG. 3 is a rear perspective view illustrating an electronic device of FIG. 1 according to an embodiment of the disclosure.

Referring to FIGS. 2 and 3, the electronic device 200 may include a housing 210 including a first surface (or a front surface) 210A, a second surface (or a rear surface) 210B, and a side surface 210C surrounding the space between the first surface 210A and the second surface 210B. In another embodiment (not illustrated), the term "housing" may refer to a structure forming some of the first surface 210A, the second surface 210B, and the side surface 210C of FIG. 1. According to an embodiment, at least a portion of the first surface 210A may be formed by a substantially transparent front plate 202 (e.g., a glass plate or a polymer plate including various coating layers). The second surface 210B may be formed by a substantially opaque rear plate 211. The rear plate 211 may be made of, for example, coated or colored glass, ceramic, a polymer, a metal (e.g., aluminum, stainless steel (STS), or magnesium), or a combination of two or more of these materials. The side surface 210C may be formed by a side bezel structure 218 (or a "side member") coupled to the front plate 202 and the rear plate 211 and including a metal and/or a polymer. In some embodiments, the rear plate 211 and the side bezel structure 218 may be integrally formed, and may include the same material (e.g., a metal material such as aluminum).

In the illustrated embodiment, the front plate 202 may include two first areas 210D, which are bent from the first surface 210A toward the rear plate 211 and extend seamlessly, at the long opposite side edges thereof. In the illustrated embodiment (see FIG. 3), the rear plate 211 may include two second areas 210E, which are bent from the second surface 210B toward the front plate 202 and extend seamlessly, at the long opposite side edges thereof In some embodiments, the front plate 202 (or the rear plate 211) may include only one of the first areas 210D (or the second areas 210E). In some embodiments, some of the first areas 210D and the second areas 210E may not be included. In the above-described embodiments, when viewed from a side of the electronic device 200, the side bezel structure 218 may have a first thickness (or width) on the side in which the first areas 210D or the second areas 210E are not included, and may have a second thickness, which is smaller than the first thickness, on the side in which the first areas 210D or the second areas 210E are included.

According to an embodiment, the electronic device 200 may include at least one of a display 201, an input device 203, a sound output device 207 or 214, a sensor module 204 or 219, a camera module 205, 212, or 213, a key input device 217, an indicator (not illustrated), or a connector 208 or 209. In some embodiments, in the electronic device 200, at least one of the components (e.g., the key input devices 117 or the indicator) may be omitted, or other components may be additionally included.

The display 201 may be visible through, for example, a considerable portion of the front plate 202. In some embodiments, at least a part of the display 201 may be visible through the front plate 202 forming the first surface 210A and the first areas 210D of the side surfaces 210C. The display 201 may be coupled to or disposed adjacent to a touch-sensitive circuit, a pressure sensor capable of measuring touch intensity (pressure), and/or a digitizer configured to detect a magnetic-field-type stylus pen. In some embodiments, at least some of the sensor modules 204 and 219 and/or at least some of the key input devices 217 may be disposed in the first areas 210D and/or the second areas 210E.

In some embodiments (not illustrated), at least one of the audio module (e.g., sound output device 214), the sensor module 204, the camera module 105 (e.g., a front camera module), and the fingerprint sensor may be included in the rear surface of the screen display area of the display 201. In some embodiments (not illustrated), the display 201 may be coupled to or disposed adjacent to a touch-sensitive circuit, a pressure sensor capable of measuring the intensity of a touch (pressure), and/or a digitizer that detects an electromagnetic-field-type stylus pen. In some embodiments, at least some of the sensor modules 204 and 219 and/or at least some of the key input devices 217 may be disposed in the first areas 210D and/or the second areas 210E.

The input device 203 may include a microphone. In some embodiments, the input device 203 may include a plurality of microphones arranged to sense the direction of sound. The sound output devices 207 and 214 may include speakers (e.g., sound output devices 207 and 214). The speakers (e.g., sound output devices 207 and 214) may include an external speaker (e.g., sound output device 207) and a phone call receiver (e.g., sound output device 214). According to some embodiments, the input device 203 (e.g., a microphone), the speakers (e.g., sound output devices 207 and 214), and the connectors 208 and 209 are disposed in the space in the electronic device 200, and may be exposed to the external environment through one or more holes formed in the housing 210. According to some embodiments, the holes formed in the housing 210 may be commonly used for the input device 203 (e.g., a microphone) and the speakers (e.g., sound output devices 207 and 214). According to some embodiments, the sound output devices 207 and 214 may include a speaker that operates without a separate speaker hole formed in the housing 210 (e.g., a piezo speaker).

The sensor modules 204 and 219 may generate electrical signals or data values corresponding to the internal operating state or the external environmental state of the electronic device 200. The sensor modules 204 and 219 may include, for example, a first sensor module 204 (e.g., a proximity sensor) and/or a second sensor module (not illustrated) (e.g., a fingerprint sensor) disposed on the first surface 210A of the housing 210, and/or a third sensor module 219 (e.g., an HRM sensor) disposed on the second surface 210B of the housing 210. The fingerprint sensor may be disposed not only on the first surface 210A (e.g., the display 201) of the housing 210, but also on the second surface 210B. The electronic device 200 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212, and 213 may include a first camera device 205 disposed on the first surface 210A of the electronic device 200, a second camera device 212 disposed on the second surface 210B thereof, and/or a flash (e.g., camera module 213). The camera devices 205 and 212 may include one or more lenses, an image sensor, and/or an image signal processor. The flash (e.g., camera module 213) may include, for example, a light-emitting diode or a xenon lamp. The first camera device 205 may be disposed under the display panel in the form of an under-display camera (UDC). In some embodiments, two or more lenses (e.g., a wide-angle lens and a telephoto lens) and image sensors may be disposed on one surface of the electronic device 200. In some embodiments, a plurality of first camera devices 205 may be disposed on the first surface of the electronic device 200 (e.g., the surface on which a screen is displayed) in the form of an under-display camera (UDC).

The key input devices 217 may be disposed on the side surface 210C of the housing 210. In another embodiment, the electronic device 200 may not include some or all of the above-mentioned key input devices 217, and a key input device 217, which is not included in the electronic device 101, may be implemented in another form, such as a soft key, on the display 201. In some embodiments, a key input device 217 may be implemented using a pressure sensor included in the display 201.

The indicator may be disposed, for example, on the first surface 210A of the housing 210. The indicator may provide, for example, the status information of the electronic device 200 in an optical form. In another embodiment, the indicator may provide a light source that is interlocked with, for example, the operation of the camera module 205. The indicator may include, for example, an LED, an IR LED, and a xenon lamp.

The connectors 208 and 209 may include a first connector hole (e.g., connector 208), which is capable of accommodating a connector (e.g., a USB connector) for transmitting/receiving power and/or data to/from an external electronic device, and/or a second connector hole (e.g., connector 209), which is capable of accommodating a connector (e.g., an earphone jack) for transmitting/receiving an audio signal to/from an external electronic device.

Some of the camera modules 205 and 212 (e.g., the camera module 205), some of the sensor modules 204 and 219 (e.g., the sensor module 204), or the indicator may be disposed to be visible through the display 201. The camera module 205 may be disposed to overlap the display area, and a screen may also be displayed on the display area corresponding to the camera module 205. Some sensor modules 204 may be disposed in the internal space in the electronic device so as to perform the functions thereof without being visually exposed through the front plate 202.

Figure 4:
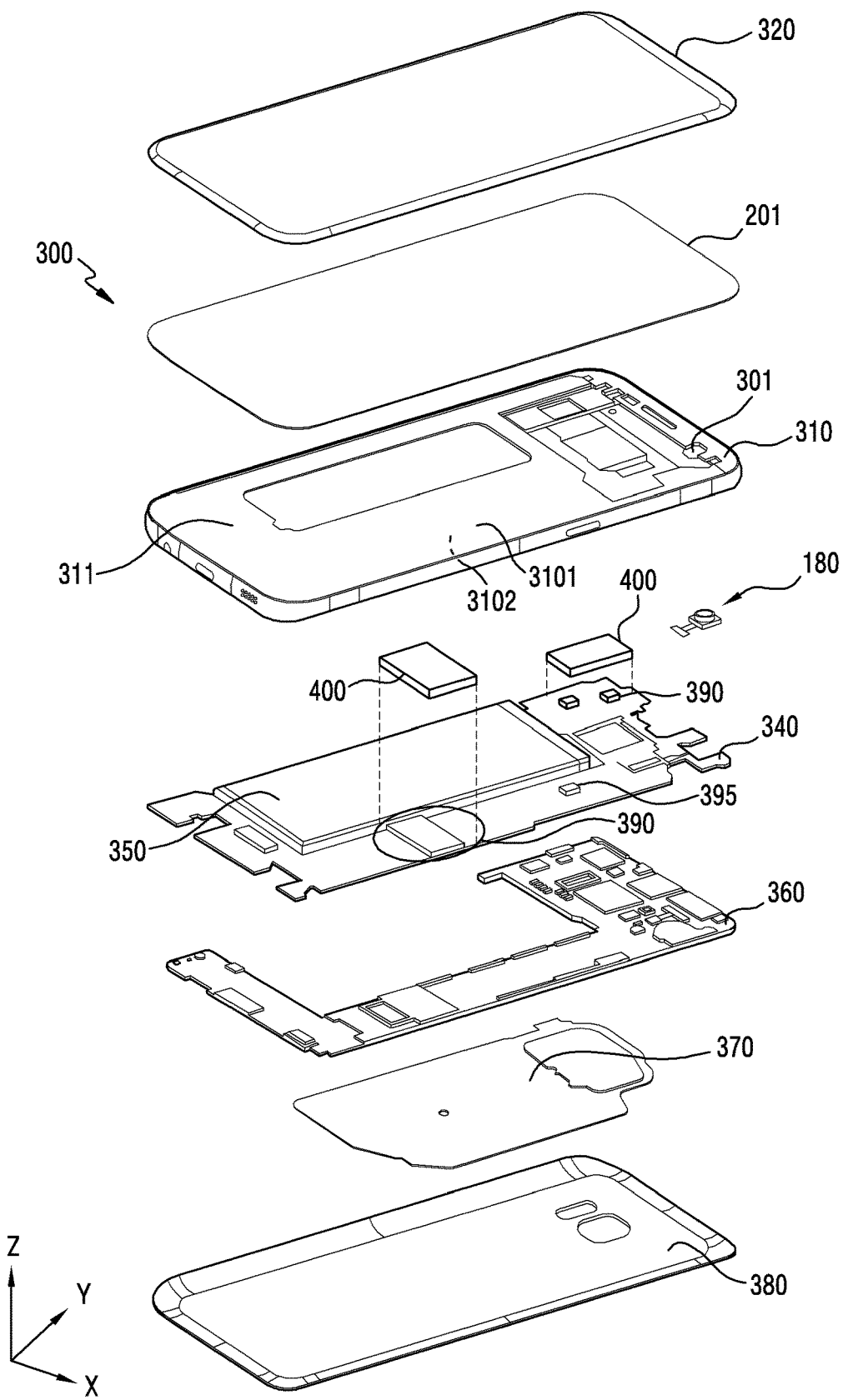
FIG. 4 is an exploded perspective view illustrating an electronic device according to an embodiment of the disclosure.

FIG. 4 is an exploded perspective view illustrating an electronic device according to an embodiment of the disclosure.

Referring to FIG. 4, the electronic device 300 (e.g., the electronic device 101 in FIG. 1 or the electronic device 200 in FIG. 2) may include a side structure 310 (e.g., a side bezel structure), a first support member 311 (e.g., a bracket or a support structure), a front plate 320 (e.g., a front cover), a display 201, a printed circuit board (PCB) 340, a battery 350, a second support member 360 (e.g., a rear case), an antenna 370, a rear plate 380 (e.g., a rear cover), and/or a heat dissipation structure 400. The heat dissipation structure 400 may include a shielding sheet (e.g., the shielding sheet 420 in FIG. 6A) for dissipating the heat generated from a heat-generating component 390.

In some embodiments, in the electronic device 300, at least one of the components (e.g., the first support member 311 or the second support member 360) may be omitted, or other components may be additionally included. At least one of the components of the electronic device 300 may be the same as or similar to at least one of the components of the electronic device 101 of FIG. 1 or the electronic device 200 of FIG. 2, and a redundant description will be omitted below.

The first support member 311 may be disposed inside the electronic device 300, and may be connected to the side structure 310, or may be formed integrally with the side structure 310. The first support member 311 may be formed of, for example, a metal material and/or a non-metal (e.g., polymer) material. The display 330 may be coupled to one side of the first support member 311, and the printed circuit board 340 may be coupled to the other side of the first support member 311. On the printed circuit board 340, one or more heat-generating components 390, a plurality of peripheral circuit components 395, and an interface may be mounted. The plurality of peripheral circuit components 395 may be located on the front surface and/or the rear surface of the printed circuit board 340.

The interface may include, for example, a high-definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/MMC connector, or an audio connector.

The battery 350 is a device for supplying power to at least one component of the electronic device 300, and may include, for example, a non-rechargeable primary battery, a rechargeable secondary battery, or a fuel cell. At least a portion of the battery 350 may be disposed to be substantially flush with, for example, the printed circuit board 340. The battery 350 may be integrally disposed inside the electronic device 300. In another embodiment, the battery 350 may be disposed to be detachable from/attachable to the electronic device 300.

The antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by a portion of the side bezel structure 310, a portion of the first support member 311, or a combination thereof.

According to various embodiments, the first support member 311 of the side member 310 may include a first surface 3101 facing the front plate 320 and a second surface 3102 facing away from the first surface 3101 (e.g., facing the rear plate). According to some embodiments, a camera module 180 (e.g., the camera module 180 in FIG. 1) may be disposed between the first support member 311 and the rear plate 380. According to some embodiments, the camera module 180 may protrude to the front plate 320 through a through hole 301 extending from the first surface 3101 to the second surface 3102 of the first support member 311, or may be visible through the front surface (e.g., front plate 320). According to some embodiments, the portion protruding through the through hole 301 in the camera module 180 may be disposed to detect the external environment at the corresponding position of the display 201. As another example, when the camera module 180 is disposed between the display 201 and the first support member 311, the through hole 301 may be unnecessary.

Figure 5:
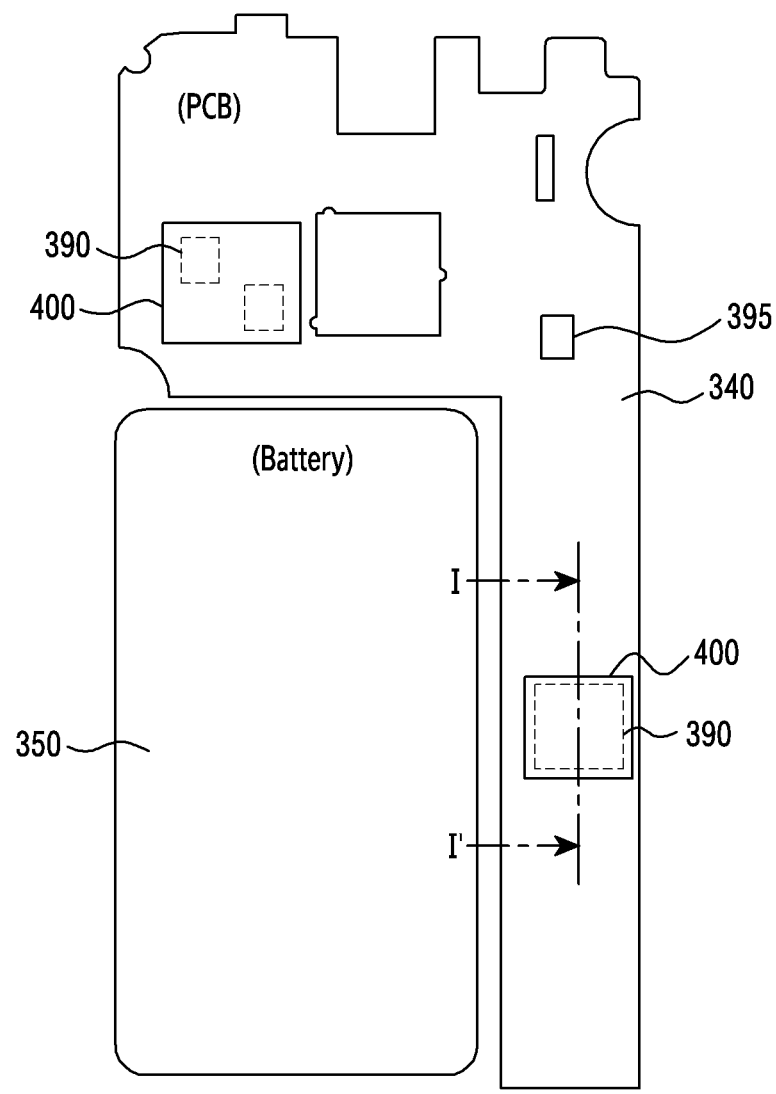
FIG. 5 is a view illustrating that a heat dissipation structure including a shielding sheet that is disposed on a printed circuit board according to an embodiment of the disclosure.

FIG. 5 is a view illustrating that a shielding sheet according to various embodiments is disposed on a printed circuit board according to an embodiment of the disclosure.

Figure 6A:
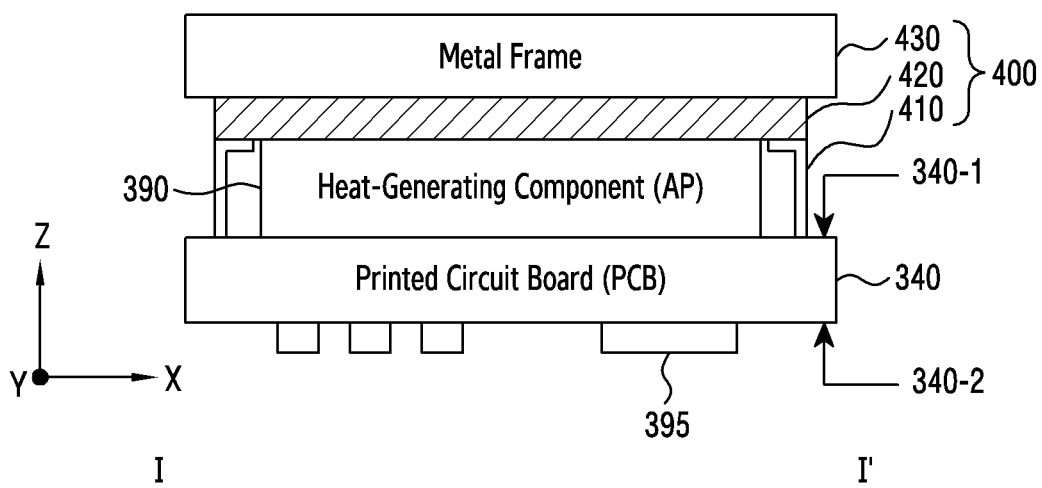
FIG. 6A is a cross-sectional view illustrating an embodiment of a shielding structure taken along line I-I' in FIG. 5 according to an embodiment of the disclosure.

FIG. 6A is a cross-sectional view of a portion of an electronic device taken along line I-I' in FIG. 5 according to an embodiment of the disclosure.

Figure 6B:
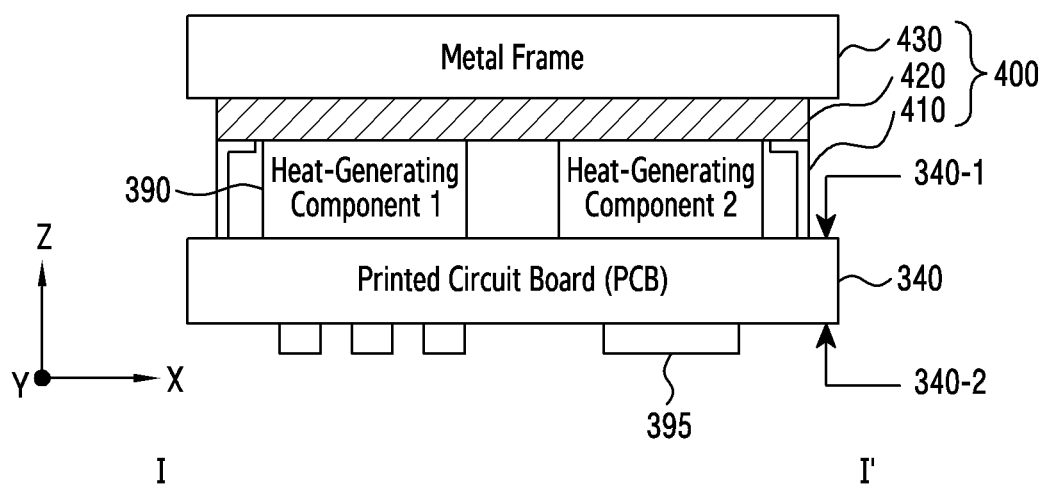
FIG. 6B is a cross-sectional view illustrating an embodiment of a shielding structure according to an embodiment of the disclosure.

FIG. 6B is a cross-sectional view illustrating an embodiment of a heat dissipation structure.

Referring to FIGS. 5 and 6A, a heat-generating component 390, a peripheral circuit component 395, and a shielding sheet 420 may be disposed on the printed circuit board 340 according to an embodiment. A battery 350 may be disposed in the vicinity of the printed circuit board 340. The heat-generating component 390 may be positioned on a first surface 340-1 of the printed circuit board 340. A plurality of peripheral circuit components 395 may be positioned on a first surface 340-1 and a second surface 340-2 of the printed circuit board 340. FIG. 6A illustrates an example in which the shielding sheet 420 is disposed to correspond to one electronic component (e.g., heat-generating component 390). However, the disclosure is not limited thereto, and the shielding sheet 420 may be disposed to correspond to a plurality of heat-generating components 390, as illustrated in FIG. 6B.

Referring to FIG. 6B, according to an embodiment, the heat-generating components 390 may include a communication module (e.g., the communication module 190 in FIG. 1), a processor (e.g., the processor 120 in FIG. 1), a controller, a power management integrated circuit (PMIC) (e.g., the power management module 188 in FIG. 1), and/or a memory (e.g., the memory 130 in FIG. 1). In an embodiment, when there are multiple heat-generating components 390, the heat-generating components 390 may be disposed side by side on the printed circuit board 340.

In an embodiment, the processor may include at least one of an application processor (AP), a central processing unit (CPU), a graphics processing device (e.g., a mobile graphics processing unit (GPU), a CP (central processor), an image signal processor, a communication processor, and a sensor hub processor.

In an embodiment, the memory may be high-bandwidth memory (HBM), dynamic random access memory (DRAM), static random access memory (SRAM), phase-change random access memory (PRAM), magnetic random access memory (MRAM), resistive random access memory (RRAM), flash memory, or electrically erasable programmable read-only memory (EEPROM).

In an embodiment, the electronic device (e.g., the electronic device 101 in FIG. 1) may include a shielding member 410, a shielding sheet 420, and/or a metal frame. For example, the metal frame 430 may be included in the first support member 311 of FIG. 4. As another example, the metal frame 430 may be included in the second support member 360 of FIG. 4.

According to an embodiment, at least one heat-generating component 390 may be positioned on the first surface 340-1 of the printed circuit board 340. The shielding member 410 may be disposed to surround the side surface of the heat-generating component 390. In an embodiment, the shielding member 410 may be a shield can. The shielding member 410 may have a heat dissipation function as well as an electro-magnetic interference (EMI) function.

As an embodiment, when a shield can is applied as the shielding member 410, the shield can may be formed of a metal material having high thermal conductivity.

As an embodiment, the shielding member 410 (e.g., a shield can) may contain a material having high conductivity, such as SUS, copper (Cu), nickel (Ni), silver (Ag), gold (Au), or aluminum (Al). In some embodiments, the shielding member 410 may be made of a composite material containing a thermally conductive filler or a polymer. The thermally conductive filler may include at least one of, for example, a metal filler, a ceramic filler, or a carbon filler. The metal filler may include, for example, at least one of copper (Cu), nickel (Ni), silver (Ag), gold (Au), or aluminum (Al). The ceramic filler may include, for example, at least one of aluminum nitride (AlN), alumina ($Al_2O_3$), boron nitride (BN), beryllium oxide (BeO), or silicon carbide (SiC). The carbon filler may include, for example, at least one of graphite, carbon nanotubes, carbon fibers, or graphene.

According to an embodiment, a shielding sheet 420 may be disposed on the heat-generating component 390 and the shielding member 410. In an embodiment, the shielding sheet 420 may be disposed on the heat-generating component 390 and the shielding member 410 in the Z-axis direction. For example, the bottom surface of the shielding sheet 420 may be disposed so as to be in contact with the top surfaces of a plurality of heat-generating components 390. As another example, the bottom surface of the shielding sheet 420 may be disposed to be in contact with the shielding member 410.

According to an embodiment, the shielding sheet 420 is provided with an adhesive layer (e.g., the adhesive layer 425 in FIG. 7B) having adhesive force so that the shielding sheet 420 can be attached to the heat-generating component 390. As another example, the shielding sheet 420 may be attached to the shielding member 410. The heat-generating component 390 may be shielded from the outside by the shielding member 410 and the shielding sheet 420. According to an embodiment, the shielding sheet 420 and the heat-generating component 390 or the shielding member 410 may be bonded using an adhesive member (e.g., a double-sided tape).

According to an embodiment, a metal frame 430 may be disposed on the shielding sheet 420. For example, the bottom surface of the metal frame 430 may be disposed to be in contact with the top surface of the shielding sheet 420. The metal frame 430 is capable of supporting the shielding sheet 420 and dissipating heat to be transferred from the shielding sheet 420. As an embodiment, the metal frame 430 may contain a material having a predetermined level of rigidity and thermal conductivity, such as SUS, copper (Cu), nickel (Ni), silver (Ag), gold (Au), or aluminum (Al). In an embodiment, the metal frame 430 may be included in the first support member 311 or the second support member 360.

Figure 7A:
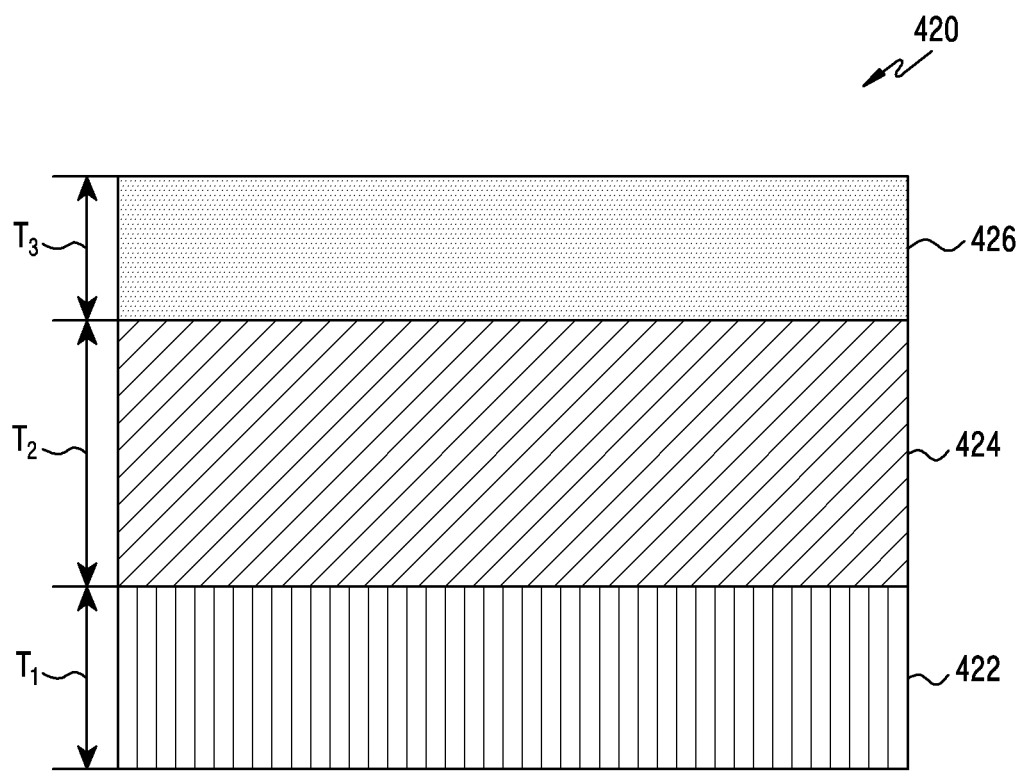
FIG. 7A is a view illustrating a cross section of a shielding sheet according to various embodiments according to an embodiment of the disclosure.

FIG. 7A is a view illustrating a cross section of a shielding sheet according to an embodiment of the disclosure.

Referring to FIGS. 6A and 7A, the shielding sheet 420 may include a first nanofiber member 422 (e.g., a high-density nanosheet), a second nanofiber member 424 (e.g., a low-density nanosheet), and/or a heat-transfer member layer 426.

According to an embodiment, the first nanofiber member 422 may be formed of polyethylene terephthalate (PET) fibers having a first diameter (e.g., a diameter in the range of about 1 μm to about 5 μm). The first nanofiber member 422 may have a first density.

According to an embodiment, the second nanofiber member 424 may be disposed on the first nanofiber member 422. The second nanofiber member 424 may be formed of PET fibers having a second diameter (e.g., a diameter in the range of about 5 μm to about 10 μm). The second nanofiber member 424 may have a second density lower than the first density.

According to an embodiment, the heat-transfer member layer 426 may be disposed on the second nanofiber member 424.

According to an embodiment, the first nanofiber member 422 and the second nanofiber member 424 may be coated with a conductive material (not illustrated). For example, the first nanofiber member 422 and the second nanofiber member 424 may be plated with a metal material. For example, the metal material may include Ni—Cu—Ni. As another example, the conductive material may permeate into the first nanofiber member or the second nanofiber member to be formed in a mesh shape. As another example, the metal material may be plated to a thickness between about 2 μm and about 4 μm. The first nanofiber member 422 or the second nanofiber member 424 may function as a shielding layer for blocking electromagnetic waves. The first nanofiber member 422 or the second nanofiber member 424 may function as a heat dissipation layer that dissipates the heat generated from the heat-generating components 390.

In an embodiment, when assembling the electronic device (e.g., the electronic device 300 in FIG. 4), the thickness of the shielding sheet 420 may be reduced through compression. Hereinafter, the thickness of the shielding sheet 420 not compressed before assembling the electronic device will be described.

According to an embodiment, the thickness T1 of the first nanofiber member 422 may be about 10 μm to about 25 μm. The thickness T2 of the second nanofiber member 424 may be about 60 μm to about 70 μm. The thickness T3 of the heat-transfer member layer 426 may be about 75 μm to about 90 μm.

Figure 7B:
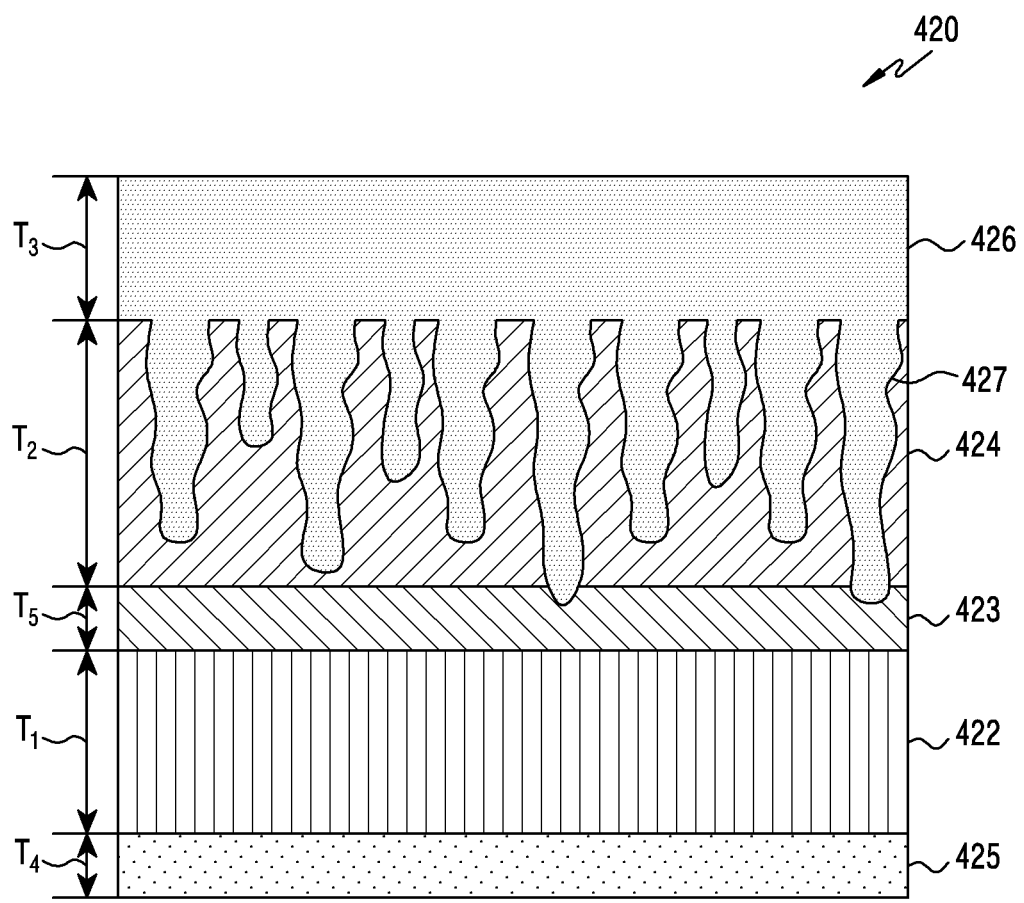
FIG. 7B is a view illustrating a cross section of a shielding sheet according to an embodiment of the disclosure.
Figures 8A, 8B, 8C:
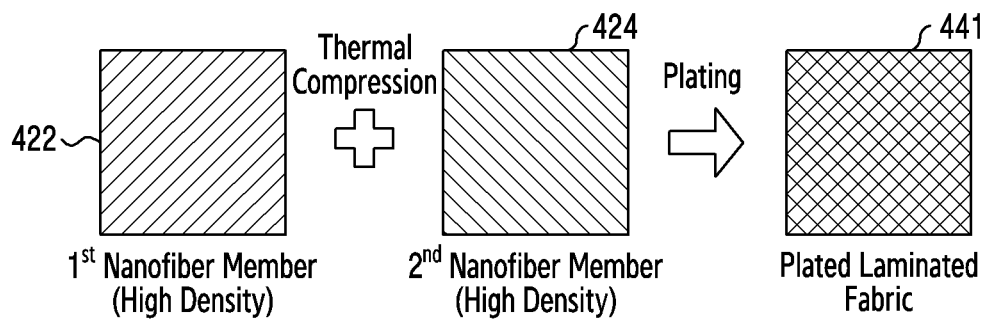
FIGS. 8A, 8B, 8C, 8D and 8E depict a view illustrating a method of manufacturing a shielding sheet according to various embodiments of the disclosure.
Figures 8D, 8E:
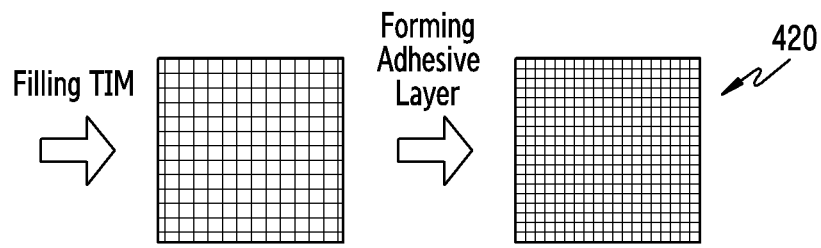

FIG. 7B is a view illustrating a cross section of a shielding sheet according to an embodiment of the disclosure.

Referring to FIGS. 6A and 7B, the shielding sheet 420 may include a first nanofiber member 422 (e.g., a high-density nanosheet), a second nanofiber member 424 (e.g., a low-density nanosheet), a bonding layer 423, an adhesive layer 425, and/or a heat-transfer member layer 426.

According to an embodiment, the first nanofiber member 422 may be formed of polyethylene terephthalate (PET) fibers having a first diameter (e.g., a diameter in the range of about 1 μm to about 5 μm). The first nanofiber member 422 may have a first density.

According to an embodiment, the adhesive layer 425 may be disposed under the first nanofiber member 422. As an embodiment, the adhesive layer 425 may include an adhesive material (e.g., a pressure-sensitive adhesive (PSA)). As another embodiment, the adhesive layer 425 may be a piece of double-sided tape.

According to an embodiment, the second nanofiber member 424 may be disposed on the first nanofiber member 422. The second nanofiber member 424 may be formed of PET fibers having a second diameter (e.g., a diameter in the range of about 5 μm to about 10 μm). The second nanofiber member 424 may have a second density lower than the first density.

According to an embodiment, the first nanofiber member 422 and the second nanofiber member 424 may be bonded to each other. For example, the first nanofiber member 422 and the second nanofiber member 424 may be bonded to each other using a low-temperature melting method. In an embodiment, when bonding the first nanofiber member 422 and the second nanofiber member 424 to each other, the bonding layer 423 may be formed between (or at the boundary of) the first nanofiber member 422 and the second nanofiber member 424.

According to an embodiment, the first nanofiber member 422 and the second nanofiber member 424 may be coated with a conductive material (not illustrated). For example, the first nanofiber member 422 and the second nanofiber member 424 may be plated with a metal material. For example, the metal material may include Ni—Cu—Ni. As another example, the conductive material may permeate into the first nanofiber member or the second nanofiber member to be formed in a mesh shape. As another example, the metal material may be plated to a thickness between about 2 μm and about 4 μm. The first nanofiber member 422 or the second nanofiber member 424 may function as a shielding layer for blocking electromagnetic waves. The first nanofiber member 422 or the second nanofiber member 424 may function as a heat dissipation layer that dissipates the heat generated from the heat-generating components 390.

According to an embodiment, a heat-transfer member layer 426 may be disposed on the second nanofiber member 424. The heat-transfer member layer 426 may include a heat-transfer material 427. In an embodiment, when the heat-transfer member layer 426 is disposed, at least a portion of the heat-transfer material 427 (e.g., a thermal interface material (TIM) or a phase-change material (PCM)) may be introduced into the second nanofiber member 424. For example, when a plurality of kinds of heat dissipation filler is included in the heat-transfer material 427, the plurality of kinds of heat dissipation filler may be disposed inside the second nanofiber member 424. In an embodiment, the heat-transfer material 427 may be introduced in a direction from the top surface to the bottom surface of the second nanofiber member 424. For example, the heat-transfer material 427 may be formed to have a vertically long column shape when viewed in cross section. As another example, some of the heat-transfer material 427 may be introduced up to the bonding layer 423. As another example, some of the heat-transfer material 427 may come into contact with the first nanofiber member 422. As an example, the heat-transfer material 427 may include silicon resin and/or aluminum nitride (AlN). As an example, the heat-transfer material 427 may include silicon resin and/or aluminum oxide (Al$_2$O$_2$).

According to various embodiments, the shielding sheet 420 may be formed to have a thickness in the range of about 150 μm to about 200 μm. In an embodiment, when assembling the electronic device (e.g., the electronic device 300 in FIG. 4), the thickness of the shielding sheet 420 may be reduced to a thickness in the range of about 125 μm to about 135 μm through compression. Hereinafter, the thickness of a shielding sheet 420 that is in the state of not being compressed prior to assembly of the electronic device will be described.

According to an embodiment, the thickness T1 of the first nanofiber member 422 may be about 10 μm to about 25 μm. The thickness T2 of the second nanofiber member 424 may be about 60 μm to about 70 μm. The thickness T3 of the heat-transfer member layer 426 may be about 75 μm to about 90 μm. The thickness T4 of the adhesive layer 425 may be about 5 μm to about 15 μm. The thickness T5 of the bonding layer 423 formed between the first nanofiber member 422 and the second nanofiber member 424 may be about 1 μm to about 5 μm.

In various embodiments, the shielding sheet 420 is formed to have a thickness in the range of about 150 μm to about 200 μm before compression, and a thickness in the range of about 125 μm to about 135 μm after compression, and may be made of a fiber material so as to have a flexible property. In an embodiment, even if the heat-generating components 390 have different thicknesses, the shielding sheet 420 may be flexibly bent and may be disposed to be in contact with the top surfaces of the heat-generating components 390. For example, since the shielding sheet 420 is flexibly bent, it is possible to prevent the occurrence of a gap between the shielding sheet 420 and the heat-generating components 390 due the different thicknesses or to prevent the shielding sheet 420 from being lifted from the heat-generating components 390.

In various embodiments, the shielding sheet 420 may exhibit a thermal conductivity of about 40 W/mK to about 50 W/mK and electromagnetic-wave-shielding performance of about 35 dB to about 45 dB. The heat generated from the heat-generating components 390 of the electronic device is transferred to the shielding sheet 420 and is dissipated, and electromagnetic waves generated from the heat-generating components 390 may be blocked by the shielding sheet 420.

According to an embodiment, by applying the shielding sheet 420 having a thickness of about 150 μm to about 200 μm before compression and about 125 μm to about 135 μm after compression, it is possible to reduce the thickness of the electronic device. In addition, since a single shielding sheet 420 can replace a general metal cover, a shielding film, and a liquid TIM, it is possible to reduce the number of manufacturing operations and the cost of manufacturing the heat dissipation structure 400.

FIGS. 8A, 8B, 8C, 8D and 8E depict a view illustrating a method of manufacturing a shielding sheet according to various embodiments of the disclosure.

Referring to FIGS. 7B and 8A, 8B, 8C, 8D and 8E, the second nanofiber member 424 may be positioned on the first nanofiber member 422.

According to an embodiment, while the interface between the first nanofiber member 422 and the second nanofiber member 424 is melted through a low-temperature melting method, the first nanofiber member 422 and the second nanofiber member 424 may be physically bonded so as to form a bonding layer 423. Through this, the first nanofiber member 422 and the second nanofiber member 424 may be attached to each other. A laminated fabric may be formed by attaching the first nanofiber member 422 and the second nanofiber member 424 to each other.

According to an embodiment, a coating (e.g., through an electroless plating (securing electrical conductivity and thermal conductivity) or immersion-plating method) may be applied to the laminated fabric. For example, the first nanofiber member 422 and the second nanofiber member 424 may have different forms, in which a conductive material is coated (plated) depending on the densities thereof In the case of the first nanofiber member 422 (e.g., a high-density fabric), the plating metal hardly permeates into the fabric in the vertical direction, and thus plating may be performed in a horizontal direction. In the case of the second nanofiber member 424 (e.g., a low-density fabric), the plating metal may easily permeate into the fabric, and thus plating may be performed in a vertical direction. As described above, due to the characteristics of being plated in the vertical and horizontal directions, the laminated fabric is capable of blocking electromagnetic waves emitted in the X-axis, Y-axis, and Z-axis directions at substantially the same level as a metal cover. Through this, the shielding sheet 420 may ensure electromagnetic-wave-shielding performance in the X-axis, Y-axis, and Z-axis directions.

For example, the first nanofiber member 422 and the second nanofiber member 424 having different densities can be plated in a single plating operation. As the plating material, for example, a Ni—Cu—Ni plating material may be used. For example, a plating layer having a thickness of about 3 μm may be formed on the laminated fabric. Thereafter, the plated laminated fabric 441 may be formed through firing at a predetermined temperature.

According to an embodiment, a heat-transfer material (e.g., a thermal interface material (TIM) or a phase-change material (PCM)) may be disposed on the plated laminated fabric 441. For example, the plated laminate fabric 441 may be filled with the heat-transfer material 427. As an example, as the heat-transfer material 427, one of aluminum nitride (AlN), aluminum oxide (Al$_2$O$_3$), or silicon resin, or a material in which a plurality of materials is mixed, may be used. When the heat-transfer material 427 (e.g., a thermal interface material (TIM) or a phase-change material (PCM)) is disposed, the heat-transfer member layer 426 may be formed on the second nanofiber member 424 included in the plated laminated fabric 441. In an embodiment, at least some of the heat-transfer material 427 may permeate into and fill the inside of the second nanofiber member 424.

According to an embodiment, the heat-transfer member layer 426 may be formed by spraying the heat-transfer material 427 (e.g., a thermal interface material (TIM) or a phase-change material (PCM)) onto the laminated fabric through an inkjet method or an aerosol method. At least some of the heat-transfer material 427 may permeate into the second nanofiber member 424.

When a plurality of kinds of heat dissipation filler is included in the heat-transfer material 427, the plurality of kinds of heat dissipation filler may be disposed inside the second nanofiber member 424.

According to an embodiment, the adhesive layer 425 may be formed of acrylic and aluminum hydroxide (Al$_2$O$_3$). For example, the adhesive layer 425 may be formed under the first nanofiber member 422. However, without being limited thereto, the adhesive layer 425 may be formed by attaching a piece of double-sided tape to the lower portion of the first nanofiber member 422 or by disposing an adhesive material (e.g., a pressure-sensitive adhesive (PSA)). The shielding sheet 420 may be manufactured through this operation.

Figure 9:
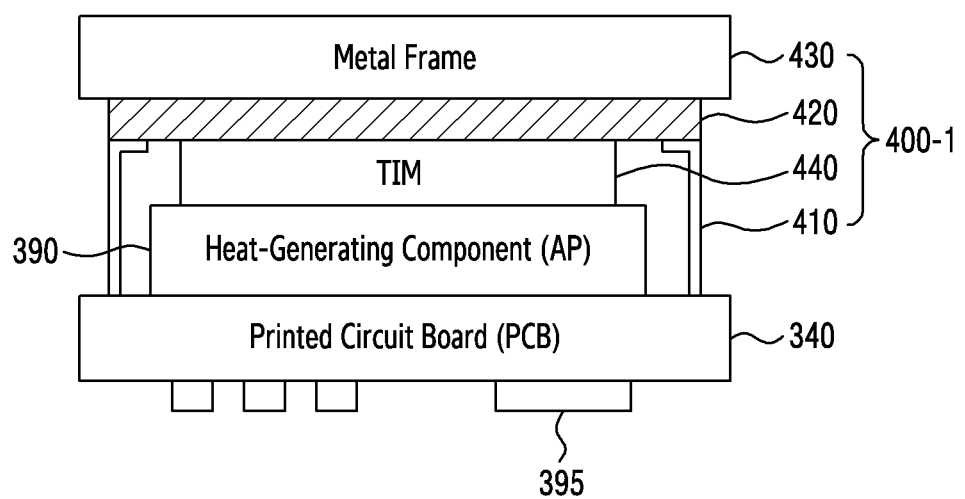
FIG. 9 is a cross-sectional view illustrating a portion of an electronic device in which a shielding sheet is disposed according to an embodiment of the disclosure.

FIG. 9 is a cross-sectional view illustrating a portion of an electronic device in which a shielding sheet is disposed according to an embodiment of the disclosure. Referring to FIG. 9, a detailed description of the same configurations as those of FIGS. 5 to 7B may be omitted.

Referring to FIGS. 5 and 9, a heat-generating component 390, a peripheral circuit component 395, and/or a shielding sheet 420 may be disposed on a printed circuit board 340 according to an embodiment.

In an embodiment, the heat-generating components 390 may include a communication module (e.g., the communication module 190 in FIG. 1), a processor (e.g., the processor 120 in FIG. 1), a controller, a power management integrated circuit (PMIC) (e.g., the power management module 188 in FIG. 1), and/or a memory (e.g., the memory 130 in FIG. 1). As an embodiment, when there are a plurality of heat-generating components 390, the heat-generating components 390 may be disposed side by side on the printed circuit board 340.

According to an embodiment, an electronic device (e.g., the electronic device 101 in FIG. 1) may include a shielding member 410, a heat transfer member 440 (e.g., a thermal interface material (TIM) or a phase-change material (PCM)), a shielding sheet 420, and/or a metal frame 430.

According to an embodiment, the heat-generating component 390 may be disposed on a first surface of the printed circuit board 340, and the shielding member 410 may be disposed to surround the side surfaces of a plurality of heat-generating components 390. As an embodiment, the shielding member 410 may be a shield can. The shielding member 410 may have a heat dissipation function as well as an electromagnetic interference (EMI) function. As an embodiment, when a shield can is applied as the shielding member 410, the shield can may be formed of a metal material having high thermal conductivity.

According to an embodiment, a heat transfer member 440 may be disposed on the heat-generating component 390 (e.g., as part of heat dissipation structure 400-1). In an embodiment, the heat transfer member 440 may be formed of a solid material or a liquid material. In an embodiment, the heat transfer member 440 may be disposed between a plurality of heat-generating components 390 and the shielding sheet 420 to enhance thermal coupling. As an example, the heat transfer member 440 may include at least one of a thermal grease, a thermally conductive reactive compound, a thermally conductive elastomer, or a thermally conductive adhesive tape. The heat generated from the heat-generating components 390 is transferred to the shielding sheet 420 through the heat transfer member 440 so that the heat from the heat-generating component 390 can be dissipated.

According to an embodiment, the shielding sheet 420 may be disposed on the heat transfer member 440 and/or the shielding member 410. For example, the bottom surface of the shielding sheet 420 may be disposed so as to be in contact with the top surface of the heat transfer member 440. As another example, the bottom surface of the shielding sheet 420 may be disposed so as to be in contact with the shielding member 410 (e.g., a shield can).

According to an embodiment, the shielding sheet 420 is provided with an adhesive layer (e.g., the adhesive layer 425 in FIG. 7B) having adhesive force so that the shielding sheet 420 can be attached to the top surface of the heat transfer member 440. According to another example, the shielding sheet 420 is provided with an adhesive layer (e.g., the adhesive layer 425 in FIG. 7B) having adhesive force so that the shielding sheet 420 can be attached to the top surface of the shielding member 410. The heat-generating component 390 may be shielded from the outside by the shielding member 410 and the shielding sheet 420.

Figure 10:
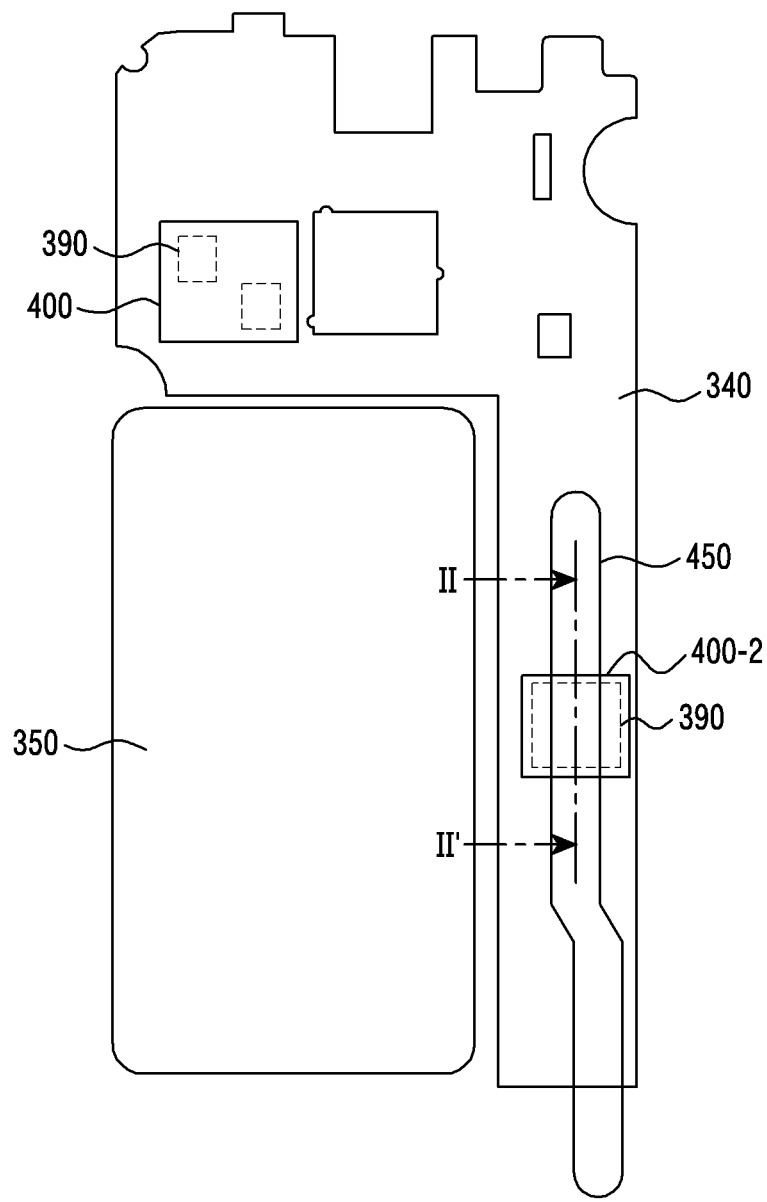
FIG. 10 is a view illustrating that a heat dissipation structure including a shielding sheet that is disposed on a printed circuit board according to an embodiment of the disclosure.

FIG. 10 is a view illustrating that a shielding sheet according to various embodiments is disposed on a printed circuit board according to an embodiment of the disclosure.

Figure 11:
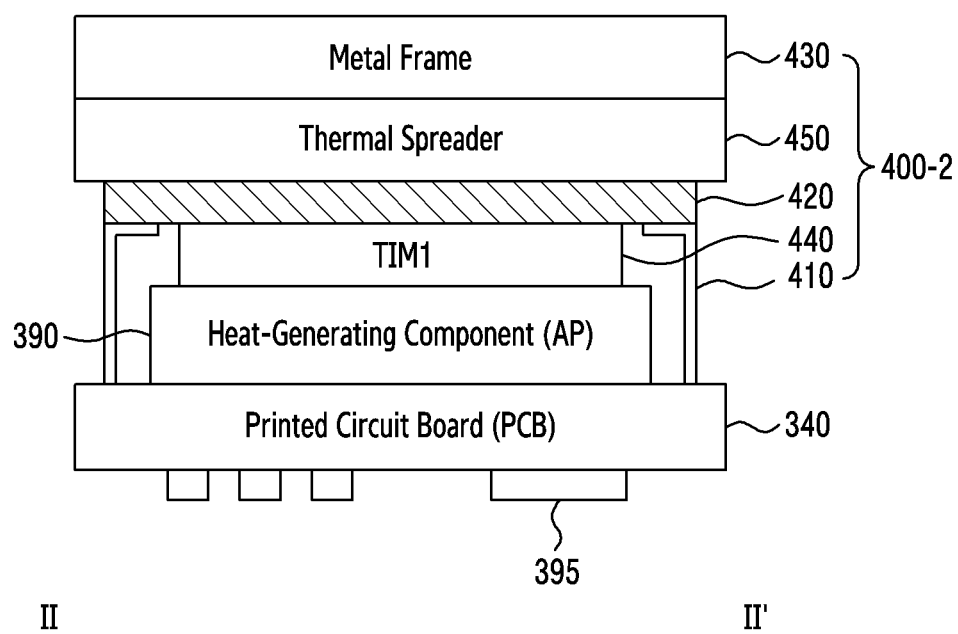
FIG. 11 is a cross-sectional view illustrating a heat dissipation structure taken along line II-II' in FIG. 10 according to an embodiment of the disclosure.

FIG. 11 is a cross-sectional view illustrating a heat dissipation structure taken along line II-II' in FIG. 10 according to an embodiment of the disclosure.

Referring to FIGS. 10 and 11, a heat-generating component 390, a peripheral circuit component 395, and/or a shielding sheet 420 may be disposed on a printed circuit board 340 according to an embodiment (e.g., in heat dissipation structure 400-2).

According to an embodiment, the heat-generating components 390 may include a communication module (e.g., the communication module 190 in FIG. 1), a processor (e.g., the processor 120 in FIG. 1), a controller, a power management integrated circuit (PMIC) (e.g., the power management module 188 in FIG. 1), and/or a memory (e.g., the memory 130 in FIG. 1). As an embodiment, when there are multiple heat-generating components 390, the heat-generating components 390 may be disposed side by side on the printed circuit board 340.

According to an embodiment, an electronic device (e.g., the electronic device 101 in FIG. 1) may include a shielding member 410, a heat transfer member 440 (e.g., a thermal interface material (TIM) or a phase-change material (PCM)), a shielding sheet 420, a thermal spreader 450, and/or a metal frame 430.

According to an embodiment, the heat-generating component 390 may be disposed on a first surface of the printed circuit board 340, and the shielding member 410 may be disposed to surround the side surface of the heat-generating component 390. As an embodiment, the shielding member 410 may be a shield can. The shielding member 410 may have a heat dissipation function as well as an electromagnetic interference (EMI) function. As an embodiment, when a shield can is applied as the shielding member 410, the shield can may be formed of a metal material having high thermal conductivity.

According to an embodiment, a heat transfer member 440 may be disposed on the heat-generating component 390. For example, the heat transfer member 440 may be in contact with the top surface of the heat-generating component 390 and the bottom surface of the shielding sheet 420. In an embodiment, the heat transfer member 440 may be formed of a solid material or a liquid material, and the thermal coupling between the heat-generating component 390 and the shielding sheet 420 can be strengthened. As an embodiment, the heat transfer member 440 may include at least one of a thermal grease, a thermally conductive reactive compound, a thermally conductive elastomer, or a thermally conductive adhesive tape. The heat generated from the heat-generating components 390 is transferred to the shielding sheet 420 through the heat transfer member 440 so that heat from the heat-generating components 390 can be dissipated.

According to an embodiment, the shielding sheet 420 may be disposed on the heat transfer member 440 and the shielding member 410. For example, the bottom surface of the shielding sheet 420 may be disposed so as to be in contact with the top surface of the heat transfer member 440. As another example, the bottom surface of the shielding sheet 420 may be disposed so as to be in contact with the shielding member 410 (e.g., a shield can). In an embodiment, the lower portion of the shielding sheet 420 is provided with an adhesive layer (e.g., the adhesive layer 425 in FIG. 7B)

having adhesive force so that the shielding sheet 420 can be attached to the top surface of the heat transfer member 440. As another example, the shielding sheet 420 may be attached to the top surface of the shielding member 410. The heat-generating component 390 may be shielded from the outside by the shielding member 410 and the shielding sheet 420.

According to an embodiment, a thermal spreader 450 may be disposed on the shielding sheet 420. For example, the bottom surface of the thermal spreader 450 may be in contact with the top surface of the shielding sheet 420, and the top surface of the thermal spreader 450 may be in contact with the metal frame 430. In an embodiment, the thermal spreader 450 may include a metal having excellent thermal conductivity, such as copper (Cu) or aluminum (Al). As an embodiment, the thermal spreader 450 may include a metal water-cooling device (e.g., a heat pipe or a vapor chamber). The thermal spreader 450 is capable of absorbing heat transferred from the shielding sheet 420 and dispersing and dissipating heat to the surroundings.

In an embodiment, a metal frame 430 may be disposed on the thermal spreader 450. The metal frame 430 may be disposed to be in contact with the top surface of the thermal spreader 450. The metal frame 430 is capable of supporting the thermal spreader 450 and dissipating heat transferred from the thermal spreader 450.

When manufacturing an electronic device (e.g., the electronic device 101 in FIG. 1) according to various embodiments, it is possible to implement an electromagnetic-wave-shielding function and a heat dissipation function through a single operation of disposing the shielding sheet 420 on the heat-generating component 390, and thus it is possible to reduce the manufacturing time and manufacturing cost of the electronic device.

Figure 12:
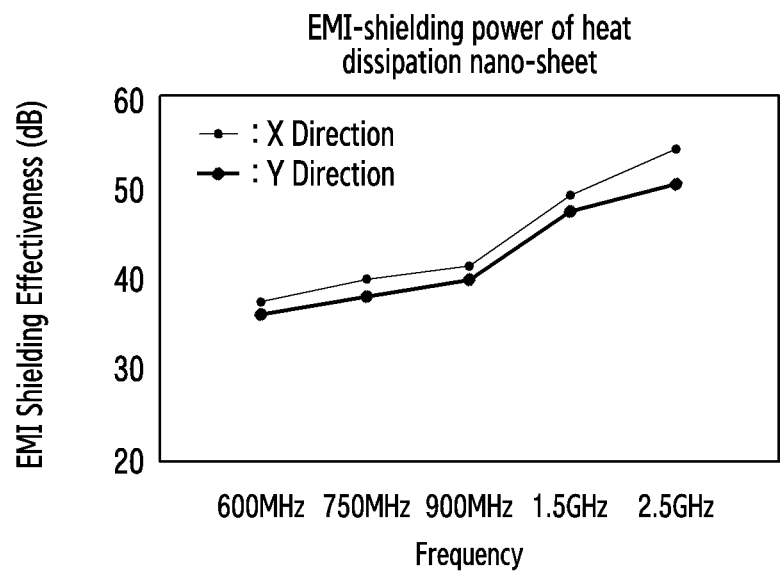
FIG. 12 is a view illustrating shielding performance of a shielding sheet according to an embodiment of the disclosure.

FIG. 12 is a view illustrating shielding performance of a shielding sheet according to an embodiment of the disclosure.

Referring to FIGS. 7B and 12, the electromagnetic-wave-shielding performance of the shielding sheet 420 for each frequency can be confirmed through a test.

When the shielding sheet 420 according to various embodiments is applied to an electronic device, it can be seen that the shielding sheet 420 has a shielding power of 37.4 dB in the X-axis direction (e.g., the horizontal direction) for electromagnetic waves of 600 MHz. It can be seen that the shielding sheet 420 has a shielding power of 36.2 dB in the Y-axis direction (e.g., the vertical direction) for electromagnetic waves of 600 MHz.

When the shielding sheet 420 according to various embodiments is applied to an electronic device, it can be seen that the shielding sheet 420 has a shielding power of 39.8 dB in the X-axis direction (e.g., the horizontal direction) for electromagnetic waves of 750 MHz. It can be seen that the shielding sheet 420 has a shielding power of 36.1 dB in the Y-axis direction (e.g., the vertical direction) for electromagnetic waves of 750 MHz.

When the shielding sheet 420 according to various embodiments is applied to an electronic device, it can be seen that the shielding sheet 420 has a shielding power of 41.4 dB in the X-axis direction (e.g., the horizontal direction) for electromagnetic waves of 900 MHz. It can be seen that the shielding sheet 420 has a shielding power of 39.9 dB in the Y-axis direction (e.g., the vertical direction) for electromagnetic waves of 900 MHz.

When the shielding sheet 420 according to various embodiments is applied to an electronic device, it can be seen that the shielding sheet 420 has a shielding power of 49.1 dB in the X-axis direction (e.g., the horizontal direction) for electromagnetic waves of 1.5 GHz. It can be seen that the shielding sheet 420 has a shielding power of 47.3 dB in the Y-axis direction (e.g., the vertical direction) for electromagnetic waves of 1.5 GHz.

When the shielding sheet 420 according to various embodiments is applied to an electronic device, it can be seen that the shielding sheet 420 has a shielding power of 53.8 dB in the X-axis direction (e.g., the horizontal direction) for electromagnetic waves of 2.5 GHz. It can be seen that the shielding sheet 420 has a shielding power of 50.3 dB in the Y-axis direction (e.g., the vertical direction) for electromagnetic waves of 2.5 GHz.

When the shielding sheet 420 according to various embodiments is applied to an electronic device, it can be seen that the shielding sheet 420 has an average shielding power of 44.3 dB in the X-axis direction (e.g., the horizontal direction) for electromagnetic waves of 600 MHz to 2.5 GHz.

When the shielding sheet 420 according to various embodiments is applied to an electronic device, it can be seen that the shielding sheet 420 has an average shielding power of 42.36 dB in the X-axis direction (e.g., the horizontal direction) for electromagnetic waves of 600 MHz to 2.5 GHz.

A portable communication device (e.g., the electronic device 300 in FIG. 4) according to various embodiments may include a first nanofiber member 422 having a first density, a second nanofiber member 424 attached to the first nanofiber member 422 and having a second density lower than the first density, a heat transfer member positioned on or above the second nanofiber member 424, and a conductive material coated on at least a portion of the first nanofiber member and the second nanofiber member. At least some of the conductive material penetrates into the first nanofiber member 422 or the second nanofiber member 424.

At least some of the material of the heat transfer member penetrates into the second nanofiber member 424.

The portable communication device according to various embodiments may further include an electronic component (e.g., the heat-generating component 390 in FIG. 5), positioned under the first nanofiber member 422, and an adhesive layer 425 positioned between the first nanofiber member 422 and the electronic component (e.g., the heat-generating component 390 in FIG. 5). At least some of the material of the adhesive layer 425 may penetrate into the first nanofiber member 422.

The heat transfer member positioned on or above the second nanofiber member 424 forms a heat-transfer member layer 426.

The first nanofiber member 422 may be formed of polyethylene terephthalate (PET) fibers having a diameter of 1 μm to 5 μm.

The second nanofiber member 424 may be formed of PET fibers having a diameter of 5 μm to 10 μm.

The portable communication device according to various embodiments may further include a bonding layer 423, which is formed when the first nanofiber member 422 and the second nanofiber member 424 are bonded to each other through a low-temperature melting method. The conductive material may penetrate into the first nanofiber member 422 or the second nanofiber member 424 so as to form a mesh shape.

The portable communication device according to various embodiments may further include a thermal spreader 450 positioned on the heat dissipation sheet (e.g., shielding sheet 420). The thermal spreader 450 may be a heat pipe or a vapor chamber.

A heat dissipation sheet (e.g., shielding sheet 420) according to various embodiments may include a first nanofiber member 422 having a first density, a second nanofiber member 424 attached to the first nanofiber member 422 and having a second density lower than the first density, a heat transfer member positioned on or above the second nanofiber member 424, and a conductive material coated on at least a portion of the first nanofiber member 422 and the second nanofiber member 424. At least some of the conductive material may penetrate into the first nanofiber member 422 or the second nanofiber member 424.

The first nanofiber member 422 may be formed of polyethylene terephthalate (PET) fibers having a diameter of 1 µm to 5 µm.

The second nanofiber member 424 may be formed of PET fibers having a diameter of 5 µm to 10 µm.

The heat dissipation sheet (e.g., shielding sheet 420) according to various embodiments may further include a bonding layer 423, which is formed when the first nanofiber member 422 and the second nanofiber member 424 are bonded to each other through a low-temperature melting method.

The heat transfer member positioned on or above the second nanofiber member 424 may form a heat-transfer member layer 426.

At least some of the material of the heat transfer member fills the second nanofiber member 424.

The heat-transfer member layer 426 may have a thickness of 75 µm to 90 µm.

The heat dissipation sheet (e.g., shielding sheet 420) according to various embodiments may further include an adhesive layer 425 positioned under the first nanofiber member 422. The adhesive layer 425 may be attached to the top surface of a heat-generating component (e.g., the heat-generating component 390).

The adhesive layer 425 has a thickness of 5 µm to 15 µm.

The conductive material may penetrate into the first nanofiber member 422 or the second nanofiber member 424 so as to form a mesh shape.

The first nanofiber member 422 may have a thickness of 10 µm to 25 µm.

The second nanofiber member 424 may have a thickness of 60 µm to 70 µm.

The heat dissipation sheet (e.g., shielding sheet 420) according to various embodiments may have a thickness of about 150 µm to 200 µm before compression and a thickness of about 125 µm to 135 µm after compression.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program #40) including one or more instructions that are stored in a storage medium (e.g., internal memory #36 or external memory #38) that is readable by a machine (e.g., the electronic device #01) . For example, a processor (e.g., the processor #20) of the machine (e.g., the electronic device #01) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
   a first nanofiber member having a first density;
   a second nanofiber member attached to the first nanofiber member and having a second density lower than the first density;
   a heat transfer member positioned on or above the second nanofiber member; and
   a conductive material coated on at least a portion of the first nanofiber member and the second nanofiber member, wherein at least some of the conductive material penetrates into the first nanofiber member or the second nanofiber member.

2. The portable communication device of claim 1, wherein at least some of a material of the heat transfer member penetrates into the second nanofiber member.

3. The portable communication device of claim 1, further comprising:
   an electronic component positioned under the first nanofiber member; and
   an adhesive layer positioned between the first nanofiber member and the electronic component, wherein at least some of a material of the adhesive layer penetrates into the first nanofiber member.

4. The portable communication device of claim 1, wherein the heat transfer member positioned on or above the second nanofiber member forms a heat-transfer member layer.

5. The portable communication device of claim 1,
   wherein the first nanofiber member is formed of polyethylene terephthalate (PET) fibers having a diameter of 1 μm to 5 μm, and
   wherein the second nanofiber member is formed of PET fibers having a diameter of 5 μm to 10 μm.

6. The portable communication device of claim 1, further comprising:
   a bonding layer formed when the first nanofiber member and the second nanofiber member are bonded to each other through a low-temperature melting method.

7. The portable communication device of claim 1, wherein the conductive material penetrates into the first nanofiber member or the second nanofiber member so as to form a mesh shape.

8. The portable communication device of claim 1, further comprising:
   a thermal spreader positioned on a heat dissipation sheet, wherein the thermal spreader is a heat pipe or a vapor chamber.

9. A heat dissipation sheet comprising:
   a first nanofiber member having a first density;
   a second nanofiber member attached to the first nanofiber member and having a second density lower than the first density;
   a heat transfer member positioned on or above the second nanofiber member; and
   a conductive material coated on at least a portion of the first nanofiber member and the second nanofiber member, wherein at least some of the conductive material penetrates into the first nanofiber member or the second nanofiber member.

10. The heat dissipation sheet of claim 9,
    wherein the first nanofiber member is formed of polyethylene terephthalate (PET) fibers having a diameter of 1 μm to 5 μm, and
    wherein the second nanofiber member is formed of PET fibers having a diameter of 5 μm to 10 μm.

11. The heat dissipation sheet of claim 9, further comprising:
    a bonding layer formed when the first nanofiber member and the second nanofiber member are bonded to each other through a low-temperature melting method.

12. The heat dissipation sheet of claim 9, wherein the heat transfer member positioned on or above the second nanofiber member forms a heat-transfer member layer.

13. The heat dissipation sheet of claim 12, wherein at least some of a material of the heat transfer member fills the first nanofiber member or the second nanofiber member.

14. The heat dissipation sheet of claim 12, wherein the heat-transfer member layer has a thickness of 75 μm to 90 μm.

15. The heat dissipation sheet of claim 9, further comprising:
    an adhesive layer positioned under the first nanofiber member,
    wherein the adhesive layer is attached to a top surface of a heat-generating component.

16. The heat dissipation sheet of claim 15, wherein the adhesive layer has a thickness of 5 μm to 15 μm.

17. The heat dissipation sheet of claim 9, wherein the conductive material penetrates into the first nanofiber member or the second nanofiber member so as to form a mesh shape.

18. The heat dissipation sheet of claim 9, wherein the first nanofiber member has a thickness of 10 μm to 25 μm.

19. The heat dissipation sheet of claim 9, wherein the second nanofiber member has a thickness of 60 μm to 70 μm.

20. The heat dissipation sheet of claim 9, wherein the heat dissipation sheet has a thickness of about 150 μm to 200 μm before compression and a thickness of about 125 μm to 135 μm after compression.

21. The heat dissipation sheet of claim 9, wherein the heat transfer member comprises a heat transfer material including at least one of a thermal interface material (TIM) or a phase-change material (PCM).

22. The heat dissipation sheet of claim 21, wherein at least a portion of the heat transfer material is introduced from at least a top surface of the second nanofiber member to a bottom surface of the second nanofiber member.

23. The heat dissipation sheet of claim 21, wherein the heat transfer material comprises at least one of silicon resin, aluminum nitride (AlN), or aluminum oxide ($Al_2O_3$).

* * * * *